(12) United States Patent
Mamiya

(10) Patent No.: US 7,019,848 B2
(45) Date of Patent: Mar. 28, 2006

(54) THREE-DIMENSIONAL MEASURING INSTRUMENT, FILTER STRIPED PLATE, AND ILLUMINATING MEANS

(75) Inventor: Takahiro Mamiya, Komaki (JP)

(73) Assignee: CKD Corporation, Aichi (JP)

( * ) Notice: Subject to any disclaimer, the term of this patent is extended or adjusted under 35 U.S.C. 154(b) by 0 days.

(21) Appl. No.: 10/503,150

(22) PCT Filed: Jan. 20, 2003

(86) PCT No.: PCT/JP03/00446

§ 371 (c)(1),
(2), (4) Date: Jul. 28, 2004

(87) PCT Pub. No.: WO03/064973

PCT Pub. Date: Aug. 7, 2003

(65) Prior Publication Data

US 2005/0073590 A1    Apr. 7, 2005

(30) Foreign Application Priority Data

Feb. 1, 2002 (JP) .............................. 2002-026096

(51) Int. Cl.
*G01B 11/24* (2006.01)
*G01V 8/00* (2006.01)
*G06K 9/00* (2006.01)

(52) U.S. Cl. .................. 356/601; 356/613; 356/625; 250/559.22; 250/559.36; 382/101; 382/149

(58) Field of Classification Search ........ 356/600–625; 250/559.19, 559.22, 559.23, 559.24, 237 G, 250/559.36, 559.29, 223 R; 382/100–101, 382/112, 154, 286, 149
See application file for complete search history.

(56) References Cited

U.S. PATENT DOCUMENTS

| | | | | |
|---|---|---|---|---|
| 5,684,530 A | * | 11/1997 | White | 348/131 |
| 6,075,605 A | * | 6/2000 | Futamura et al. | 356/608 |
| 6,201,892 B1 | * | 3/2001 | Ludlow et al. | 382/149 |
| 6,333,511 B1 | * | 12/2001 | Talmi | 250/559.36 |
| 6,421,451 B1 | * | 7/2002 | Shiratsuchi et al. | 382/101 |

FOREIGN PATENT DOCUMENTS

| | | |
|---|---|---|
| JP | 58-122409 | 7/1983 |
| JP | 60-250783 | 12/1985 |
| JP | 04-098106 | 3/1992 |

(Continued)

*Primary Examiner*—Gregory J. Toatley, Jr.
*Assistant Examiner*—Sang H. Nguyen
(74) *Attorney, Agent, or Firm*—Muramatsu & Associates

(57) ABSTRACT

For measuring the three-dimensional shape of an object of measurement using a phase shift method, a three-dimensional measuring instrument is provided which is capable of shortening the measurement time. A printed state inspection device 1 includes a table for placing a printed circuit board K printed with cream solder H, an illumination device 3 for illuminating three sine wave light component patterns with different phases on the surface of printed circuit board K, a CCD camera 4 for picking-up images of the illuminated part of the printed circuit board K, a white light illumination unit L for illuminating a white light on the surface of printed circuit board K, and a laser pointer for measuring the standard height. A control device 7 determines the existing area of the cream solder H from the image data obtained by the illumination of the white light, and calculates the height of the cream solder H from the image data obtained by the illumination device 3 by using a phase shift method.

18 Claims, 6 Drawing Sheets

FOREIGN PATENT DOCUMENTS

| | | |
|---|---|---|
| JP | 05-280945 | 10/1993 |
| JP | 09-021620 | 1/1997 |
| JP | 11-023234 | 1/1999 |
| JP | 2000-028320 | 1/2000 |
| JP | 61-76906 | 10/2000 |
| JP | 2000-283736 | 10/2000 |

* cited by examiner

THREE-DIMENSIONAL MEASURING INSTRUMENT, FILTER STRIPED PLATE, AND ILLUMINATING MEANS

FIELD OF THE INVENTION

The present invention relates to a three-dimensional measuring instrument for measuring the three-dimensional shape of a measurement object with use of a phase shift method.

BACKGROUND OF THE INVENTION

Typically, when mounting electronic components on a printed circuit board, cream solder is first printed on a predetermined electrode pattern formed on the printed circuit board. Next, based on the viscosity of the cream solder, the electronic components are temporarily mounted on the printed circuit board. Then, the printed circuit board is transferred to a reflow furnace, where it is soldered through a reflow process. Nowadays, the printed state of the cream solder must be inspected prior to entering the reflow furnace, where a three-dimensional measuring instrument is used for the cream solder inspection.

In recent years, various non-contact type three-dimensional measuring instruments using light have been proposed. One of them is a technology related to a three-dimensional measuring instrument using a phase shift method (Japanese Laid-Open Publication No. 11-211443 and Japanese Patent No. 2711042).

The three-dimensional measuring instrument based on the above technology uses a CCD camera. Namely, by an illuminating means formed of a combination of a light source and a filter with a sine wave pattern, the measuring instrument illuminates a light pattern having a striped light intensity distribution on the object of measurement (in this case, the printed circuit board). Then, it is observed by using a CCD camera placed right above the printed circuit board. In this situation, the light intensity I of a point P on the screen is expressed by the following formula.

$$I = e + f \cos \phi$$

[where, e is DC current light noise (offset component), f is sine wave contrast (reflection rate), and $\phi$ is phase based on the irregularity of the object)

At this point, by shifting the light pattern, the phase is changed to four steps ($\phi+0$, $\phi+\pi/2$, $\phi+\pi$, $\phi+3\pi/2$), and the images carrying the intensity distribution I0, I1, I2, and I3 corresponding to the four phase steps are retrieved so that positional information $\theta$ is determined by the following formula.

$$\theta = arc \tan\{(I3-I1)/(I0-I2)\}$$

By using this positional information $\theta$, the three-dimensional coordinates (X, Y, Z) of the point P on the printed circuit board (cream solder) is determined so that the three-dimensional shape of the cream solder, in particular, the height thereof, can be measured.

In the three-dimensional measuring instrument based on the above technology, the phase must be changed to four steps to obtain four images carrying the intensity distribution corresponding to each step. In other words, an image retrieval process has to be performed every time when the phase is changed, hence, requiring four image retrieval processes per point. Due to this, a long time is necessary for the image retrieval, which in turn causing a long overall measuring time from start to finish.

The present invention has been made by taking the above situation into consideration, where one of its objects is to provide a three-dimensional measuring instrument which is capable of shortening the measuring time required when measuring the three-dimensional shape of an object by the phase shift method.

DISCLOSURE OF THE INVENTION

The three-dimensional measuring instrument of the present invention is characterized in that it is comprised of a uniform light illumination source which is capable of uniformly illuminating a measurement object as well as non-measurement objects surrounding the measurement object, an illuminating means which is capable of illuminating at least two light component patterns with different wave length and different relative phase relationships and striped light intensity distribution to at least the measurement object at the same time, an image retrieval means which is capable of retrieving an image of light reflected from the measurement object and the surrounding non-measurement objects illuminated by the uniform light source as well as separating the light reflected from at least the measurement object illuminated with the light component patterns per each light component, an area extracting means for extracting an area where the measurement object exists based on the image data from the image retrieval means derived from the uniform light, and a computing means for calculating a height of at least the measurement object at a predetermined location where the area of existence of the measurement object is detected by the area extracting means.

According to the present invention, the uniform light is illuminated on the measurement object as well as the surrounding non-measurement objects by the uniform light illumination source. Further, images of the light reflected from the measurement object as well as the surrounding non-measurement objects illuminated by the uniform light are retrieved by the image retrieval means to obtain the image data. Based on the image data, the existing area of the measurement object is extracted by the area extracting means. In this case, the area of the measurement object can be accurately determined by the difference in the degree of reflection between the measurement object and the surrounding non-measurement objects. Further, at least two light component patterns are illuminated at the same time by the illuminating means at least onto the measurement object. Here, each light component pattern has the striped light intensity distribution, wave length components different from one another, as well as relative phase relationships different from one another. Then, the light reflected from the measurement object illuminated with the light component patterns is separated and its image is picked-up by the image retrieval means for each light component. Moreover, in the computing means, the predetermined height of at least the measurement object is calculated based on at least two image data obtained by the image retrieval means under the different relative phase relationships. Therefore, instead of the conventional technology where an image pick-up process has to be performed every time the relative phase relationship is changed, the image retrieval can be collectively performed for each different relative phase relationship at each light component. Due to this, the time required for illumination of the light as well as retrieving the image data relative to one point can be significantly shortened, thus, the time required for measurement can be dramatically shortened as well. In addition, as for the calculation, the area of the measurement object is extracted and determined in advance. Therefore, correction calculation for the non-measurement objects does not have to be performed. As a result, the calculation is simplified, and thus, it is possible to avoid the increase of the size of the equipment as well as to simplify the equipment.

Further, the uniform light illumination source is preferably a white light illumination unit which is capable of illuminating a white light.

When using the white light illumination and if the measurement object and the non-measurement are pre-coated with different colors, the difference in the reflected light will be represented not only in the brightness but in the color as well. Therefore, when detecting the existing area of the measurement object by the area extracting means, this area can be accurately determined by the difference in both the brightness and the color of the reflected light.

Further, the three-dimensional measuring instrument of the present invention is comprised of a white light illumination unit which is capable of illuminating a white light on the measurement object as well as the surrounding non-measurement objects, an illuminating means which is capable of illuminating at least three light component patterns having different wave length components and different relative phase relationships and striped light intensity distribution at least onto the measurement object, an image retrieval means which is capable of picking-up an image of the light reflected from the measurement object and the surrounding non-measurement object illuminated by the white light as well as separating the light reflected from at least the measurement object illuminated with the white light for each light component, an area extracting means for extracting the area where the measurement object exists based on the image data from the image retrieval means, and a computing means for calculating the predetermined height of the measurement object where the existing area of which has been detected by the area extracting means based on at least three image data retrieved for each light component by the image retrieval means.

The area extracting means preferably extracts the existing area of the measurement object based on the difference in brightness between the measurement object and the non-measurement objects.

The existing area of the measurement object is extracted from the image data by the area extracting means based on the difference in the brightness between the measurement object and the non-measurement objects. Hence, the existing area can be detected by a relatively easy process of comparing the brightness regardless of the surface colors of the measurement object and the non-measurement objects.

Further, it is preferable that an illuminating direction from the white light illumination unit to the measurement object and to the non-measurement objects has a different angle from a direction of image pick-up by the image retrieval means towards the measurement object and the non-measurement objects.

In the case of the above situation, an angle of reflection of the illuminated white light is different depending on the surface condition of the illuminated object. Accordingly, with use of the difference in the brightness of the reflected light retrieved by the image retrieval means between the measurement object and the non-measurement object, the existing area of the measurement object can be detected accurately.

Further, the area extracting means preferably extracts the existing area of the measurement object based on the difference in colors between the measurement object and the non-measurement object.

The existing area of the measurement object is extracted from the image data by the area extracting means based on the difference in colors between the measurement object and the non-measurement objects. Due to this, the area can be extracted by a relatively easy process of comparing the surface colors of the measurement object and the non-measurement objects.

Further, the illuminating means is capable of illuminating at least three light component patterns at the same time, and the computing means calculates based on the three image data, such that when the relative phase relationships different from one another are indicated as $\alpha$, 0, and $\beta$, the computing means preferably determines the positional information $\theta$ by formula (1) below as well as by $V0$, $V1$, and $V2$ which are converted values of the brightness of the measured part obtained from the three image data to be identical amplitudes and offsets, to calculate the predetermined height based on the positional information $\theta$.

$$\tan\theta = \frac{(V0-V2)\sin\beta + (V1-V2)(\sin\alpha - \sin\beta)}{(V0-V2)(1-\cos\beta) - (V1-V2)(\cos\alpha - \cos\beta)} \quad (1)$$

$$\tan\theta = \frac{(V1-V2)\sin\alpha + (-V1+V0)\sin\beta}{(V0-V2) + (-V1+V2)\cos\alpha + (V1-V0)\cos\beta}$$

In this case, the positional information $\theta$ can be determined based on a less complicated formula where the predetermined height can be calculated based on the positional information $\theta$. Therefore, when determining the predetermined height of the measurement object based on the three image data, a delay involved in complicated calculation will not occur.

Further, it is preferable that the three light component patterns having the wave length components different from one another are configured by red, green and blue components, respectively.

In this case, the wave length bands will not overlap, and the wave length band can be easily separated from the other by the image retrieval means.

Further, the illuminating means preferably is comprised of a filter striped plate mechanism which is capable of illuminating each light component pattern having a different relative phase relationship from one another at the same time by using the filter striped plate where the light from the light source is shielded in a striped manner for the predetermined wave length components and the remaining wave length components area allowed to pass therethrough.

By the filter striped plate, the predetermined wave length components are shielded in a striped manner and the remaining wave length components are allowed to pass through. Due to this, when, for example, a plurality of filter striped plates are assembled together, each of the light components is allowed to transmit in a striped manner. Further, the light components transmitted in the striped manner form patterns that are substantially sine wave form, where the relative phase relationships of the light component patterns are different from one another. Therefore, the calculation of the predetermined height of the measurement object can be conducted more accurately by the computing means.

Further, the illuminating means is preferably established with a filter striped plate where the filter striped plate is structured by one plate which has areas for allowing the light from the light source to transmit therethrough only for the predetermined wave length components arranged in a striped manner, and is capable of transmitting each light component pattern with different relative phase relationship at the same time.

By the filter striped plate, the predetermined wave length components can pass through in a striped manner. Due to this, these predetermined wave length components form light component patterns which are substantially sine wave form having relative phase relationships different from one another. Therefore, the calculation of the predetermined height of the measurement object can be conducted more accurately in the computing means. Moreover, since the filter striped plate is formed by one plate, the illuminating means can be easily designed and reduced in size and cost.

Further, the illuminating means can irradiate three light component patterns at the same time, and the filter striped plate, where the wave length components are different from one another and indicated as the first, second, and third wave length components, where the filter striped plate has area arranged in a striped manner in the order of a first area for allowing only the first wave length component to pass through, a second area for allowing only the first and second wave length components to pass through, a third area for allowing only the second and third wave length components to pass through, and a fourth area for allowing only the third wave length component to pass through.

In the filter striped plate, each striped area for allowing each wave length component is alternately and repeatedly aligned. Due to this, by only constructing four kinds of areas, light component patterns similar to the sine wave having relative phase relationships different from one another can be formed per every wave length component. When light component patterns similar to the sine wave can be formed with different relative phase relationship, more than four areas can be structured.

Further, it is preferable that the first area is colored red, the second area is colored yellow, the third area is colored cyan, and the fourth area is colored blue.

When the filter striped plates are arranged in a striped manner in the order of red, yellow, cyan, and blue, the three light component patterns, red, green, and blue having relative phase relationships different from one another can pass through. Therefore, the wave length areas will not easily overlap, and can be easily separated by the image retrieval means per every individual light component. Also, the illuminating means can be easily structured as well.

Further, the three-dimensional measuring instrument of the present invention is comprised of an illuminating means which is capable of illuminating the light having substantially uniform wave length components and the light component patterns having at least a striped light intensity distribution as well as a plurality of predetermined wave length components having relative phase relationships different from one another at the same time, an image retrieval means which is capable of separating and retrieving the image of the light reflected from the measurement object illuminated by the illuminating means per every uniform wave length component as well as per every individual predetermined light component of the plurality of predetermined wave length components, an area extracting means for extracting the existing area of the measurement object based on the image data corresponding to the uniform wave length components retrieved by the image retrieval means, and a computing means for calculating the predetermined height of at least the measurement object the existing area that has been detected by the area extracting means.

According to the present invention, the light comprising uniform wave length components and the light component patterns having at least striped light intensity distribution as well as a plurality of predetermined wave length components having relative phase relationships different from one another are illuminated at the same time by the illuminating means. Due to this, with only one illuminating means, it is possible to illuminate each light component, thereby enabling to avoid the increase of the size of the equipment that would be caused by installing separate illumination units. Moreover, by the image retrieval means, images of the uniform light components as well as the plurality of predetermined wave length components are separately retrieved for each light component, where each image data can be obtained at the same time through only one image retrieval process. Then, based on the image data of the uniform wave length components, the existing area of the measurement object is extracted by the area extracting means. In this case, the area of the measurement object can be accurately determined by the difference in the degree of reflection between the measurement object and the non-measurement objects. In the computing means, the predetermined height of at least the measurement object is calculated based on the image data corresponding to the plurality of wave length components separately retrieved by the image retrieval means. Therefore, instead of the conventional technology where an image pick-up operation is necessary every time when the relative phase relationship is changed, the image retrieval process can be collectively performed for each light component and under each different relative phase relationship. As a consequence, with one illumination and image retrieval operation with respect to one point, the necessary image data can be obtained. Therefore, the time required for measurement of one point is significantly shortened, thus, the time required for measurement is dramatically shortened as well. Moreover, the area of the measurement object is already extracted and determined prior to the calculation. Therefore, calculation for correction or compensation in view of the non-measurement objects is no longer necessary. As a result, the calculation process is simplified, and it is also possible to avoid increase of the equipment size.

Further, it is preferable that the wave length bands of the uniform wave length components and the wave length bands of the plurality of predetermined wave length components are different from one another.

In this case, images of the uniform wave length components as well as the plurality of predetermined wave length components are accurately and separately retrieved per every individual light component.

Further, it is preferable that the light component pattern has light intensity distribution which is a substantially sine wave form.

In this case, the measurement accuracy can be further improved.

Further, it is preferable to have a standard height measuring means for measuring the height of the standard surface, which is the standard for the height of the measurement object.

Since a height of the standard surface, which is the standard for the height of the measurement object, is measured by the standard height measuring means, the height (thickness) of the measurement object itself can be measured in addition to the relationship of the height position of the measurement object relative to the three-dimensional measuring instrument.

Further, the measurement object is the cream solder printed on the printed circuit board, and it is preferable to have a judging means for determining the quality of the printed state based on the area and the height of the cream solder.

The area and height of the cream solder printed on the printed circuit board is measured, where the pass/fail of the cream solder is determined based on that measured value. Therefore, each of the above effects is exhibited during the measurement of the cream solder, which enables to determine the pass/fail of the cream solder accurately.

Further, the measurement object is a solder bump mounted on the printed circuit board, and it is preferable to have a judging means for determining the pass/fail of the shape of the solder bump based on the area and height of the solder bump.

The area and height of the solder bump mounted on the printed circuit board are measured, where the pass/fail is determined based on that measured value. Therefore, each of the above effects is exhibited during the measurement of the solder bump, which enables to determine the pass/fail of the solder bump accurately.

Further, the filter striped plate in the present invention is a filter striped plate used in the three-dimensional measuring instrument and is formed of one plate, where the light from the light source is shielded in a striped manner with respect to the predetermined wave length components and the remaining wave length components are allowed to pass through, and at least two light component patterns with relative phase relationships different from one another can pass through at the same time.

According to the present invention, the predetermined wave length components transmit in a striped manner through the filter striped plate. Due to this, these predetermined wave lengths form light component patterns which is similar to the sine wave with relative phase relationships different from one another. Moreover, since at least two light component patterns can pass through at the same time for one plate, the three-dimensional measuring instrument can be comparatively easily designed, and the cost and size can be reduced as well. The three-dimensional measuring instrument can also be the "three-dimensional measuring instrument related to either one of the above inventions".

Further, it is preferable that the filter striped plate allows to pass three light component patterns at the same time where the three light components are different in the wave length from one another. With respect to the first, second, and third wave length components, a first area for transmitting only the first and second wave length components and a second area for transmitting only the second and third wave length components are alternately arranged in a striped manner.

In this manner, by arranging the first and second areas alternately, the first and third wave length components can pass through as the light component patterns similar to the sine wave with relative phase relationships different from one another. Moreover, the second wave length component is uniform across the entire striped area, and in addition to the striped light component patterns, illumination of the uniform light can be conducted at the same time.

Further, in the filter striped plate, it is preferable that the first area is colored yellow and the second area is colored cyan.

When the filter striped plate is arranged in the order of yellow and cyan, the colors red and blue can transmit the filter plate as the two light component patterns comprising wave length components different from one another. Therefore, the light component patterns with the wave length bands that will not easily overlap can pass through.

Further, the filter striped plate of the present invention is a filter striped plate used in the three-dimensional measuring instrument and is structured by one plate, where the light from the light source is shielded in a striped manner for the predetermined wave length components and the remaining wave length components are allowed to pass through, and at least three light component patterns with relative phase relationships different from one another are allowed to pass through at the same time.

According to the present invention, the predetermined wave length components are transmitted in a striped manner through the filter striped plate. Due to this, these predetermined wave length components form light component patterns of substantially sine waves with relative phase relationships different from one another. Moreover, since at least three light component patterns can transmit at the same time with only one plate, the three-dimensional measuring instrument can be comparatively easily designed and the cost and size can be reduced as well. The three-dimensional measuring instrument can also be "the three-dimensional measuring instrument related to either one of the above invention".

Further, the filter striped plate allows the three light component patterns to pass through at the same time, where the wave length components are different from one another and are indicated as the first, second, and third wave length components, and is preferably arranged in a striped manner in the order of a first area for allowing only the first wave length component to pass through, a second area for allowing only the first and second wave length components to pass through, a third area for allowing only the second and third wave length components to pass through, and a fourth area for allowing only the third wave length component to pass through.

By arranging the areas in the order of first to fourth in this manner, the first, second, and third wave length components can transmit as the light component patterns similar to the sine waves with different phases.

Further, it is preferable that the first area is colored red, the second area is colored yellow, the third area is colored cyan, and the fourth area is colored blue.

When the filter striped plate is arranged in a striped manner in the order of red, yellow, cyan, and blue as noted above, the colors red, green, and blue can transmit therethrough as the three light component patterns comprising wave length components different from one another. Therefore, light component patterns with wave length bands that will not easily overlap can pass through.

Further, the three-dimensional measuring instrument is preferably provided with a filter striped plate related to either one of the above inventions.

In addition, the illuminating means related to the present invention is preferably provided with a filter striped plate related to either one of the above inventions.

By providing the filter striped plate, an illuminating means for illuminating the plurality of light component patterns comprising wave length components different from one another can be comparatively easily designed.

BEST MODES FOR IMPLEMENTING THE INVENTION

Figure 1:
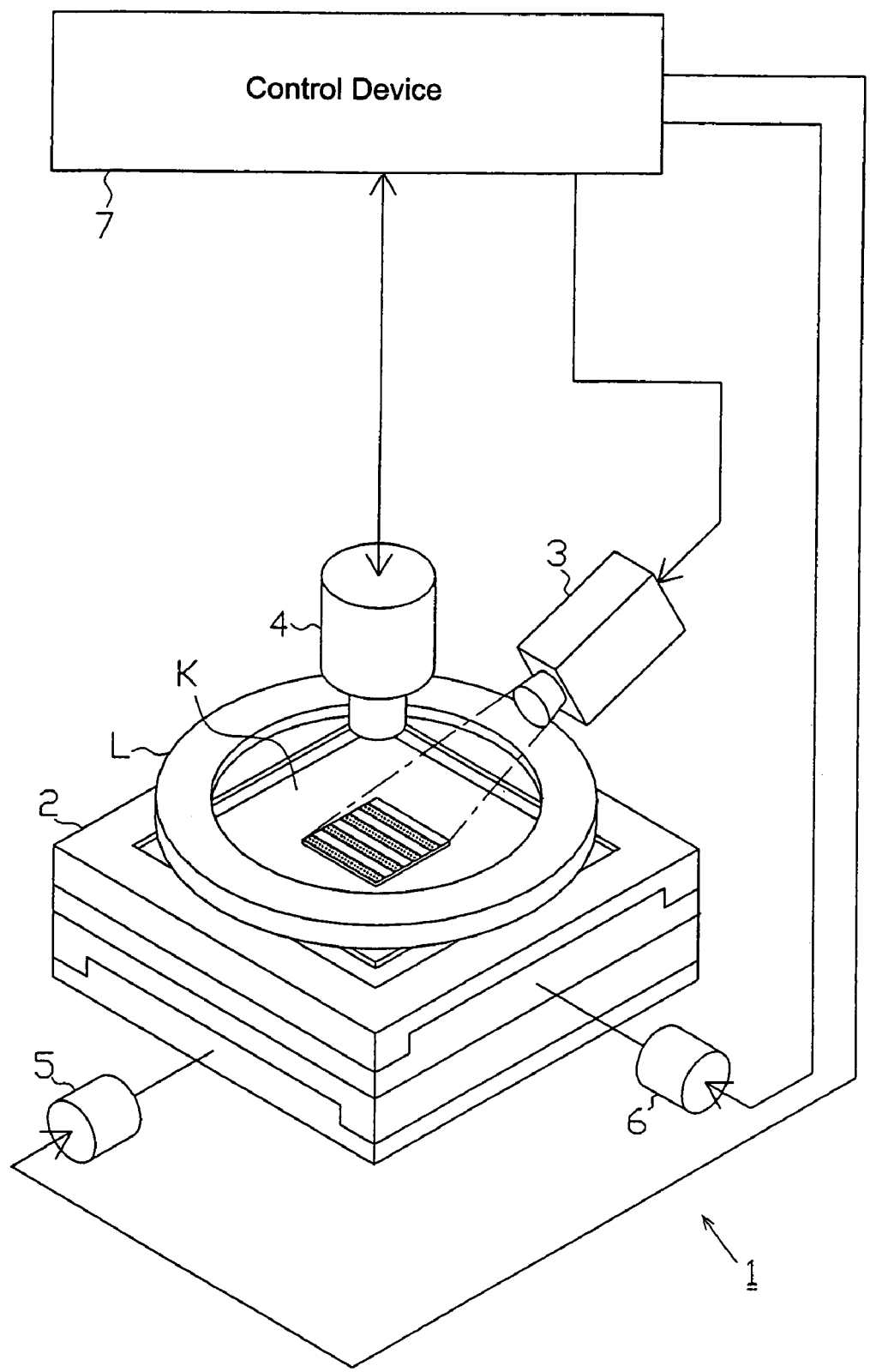
FIG. 1 is a schematic perspective view showing a typical structure of a printed state inspection device incorporating a three-dimensional measuring instrument in an embodiment of the present invention.

The embodiments of the present invention will be explained below with reference to the accompanying drawings. FIG. 1 is a schematic structural view showing the printed state inspection device 1 furnished with the three-dimensional measuring instrument in the first embodiment of the present invention. As shown in FIG. 1, the printed state inspection device 1 is comprised of a table 2 for placing a printed circuit board K printed with cream solder H as an object of measurement, an illumination device 3 provided with the illuminating means for illuminating a predetermined light component pattern from above in a diagonal direction towards the surface of printed circuit board K, a CCD camera 4 provided with an image retrieval means for obtaining images of the illuminated part on the printed circuit board K, a white light illumination unit L for illuminating a white light on the surface of the printed circuit board K, and a laser pointer (not shown) for measuring a standard height. The cream solder H in this example is printed on the electrode pattern made of copper films established on the printed circuit board K.

Motors 5 and 6 are established on the table 2, and the printed circuit board K placed on the table 2 is slidably movable in a desired direction (X-axis and Y-axis directions) by the motors 5 and 6.

The white light illumination unit L is established above the printed circuit board K and under the CCD camera 4. Since the white light illumination unit L is ring-shaped having a relatively large diameter, the image retrieval of the printed circuit board K by the CCD camera 4 will not be interfered. Moreover, the white light illumination unit L illuminates the white light in a diagonally downward direction towards the center. Namely, the white light is illuminated from above of the periphery of the printed circuit board K in the diagonal direction onto the printed circuit board K.

Figure 2:
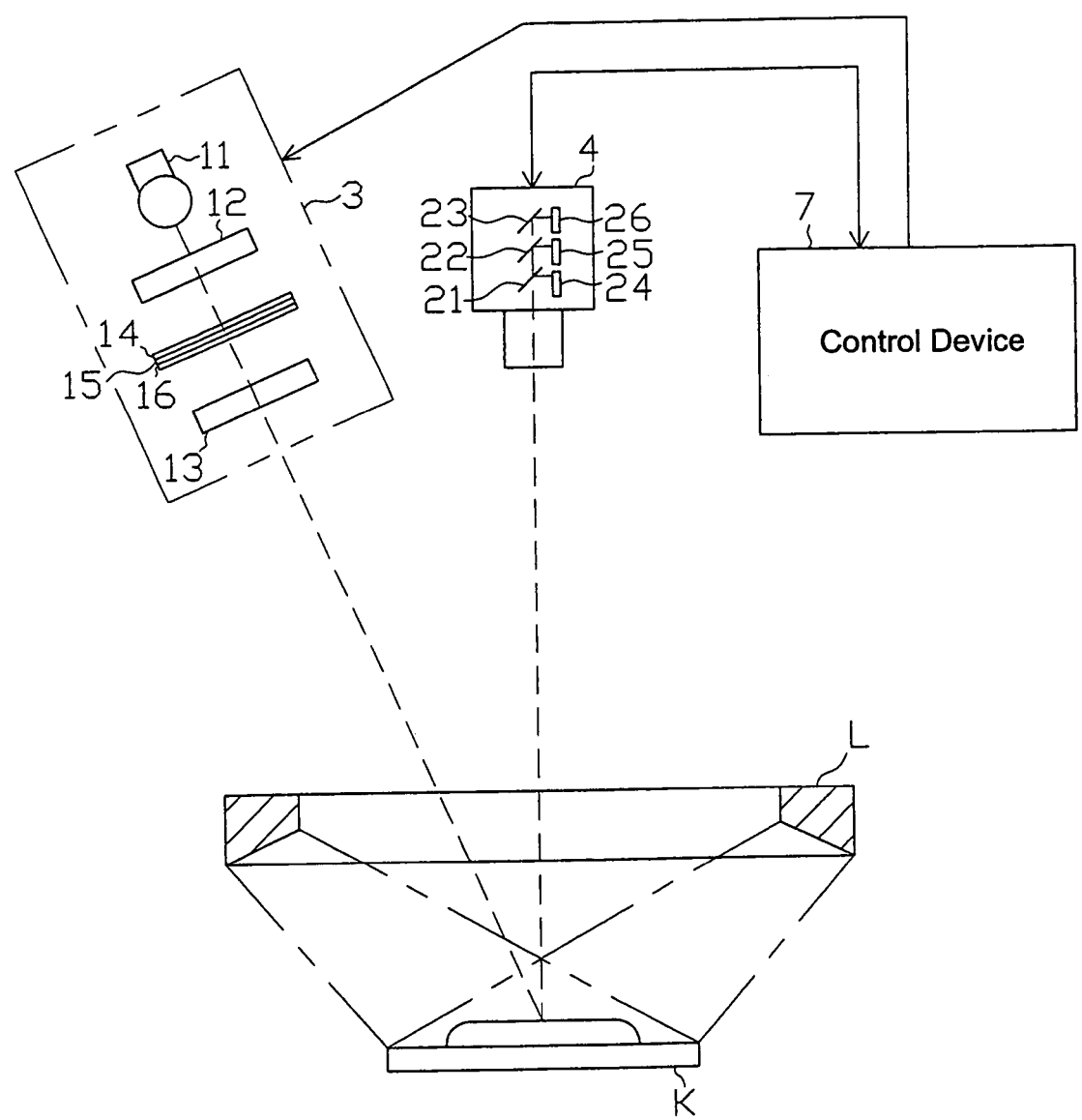
FIG. 2 is a schematic diagram showing a more detailed structure of the three-dimensional measuring instrument in the embodiment.
Figure 3:
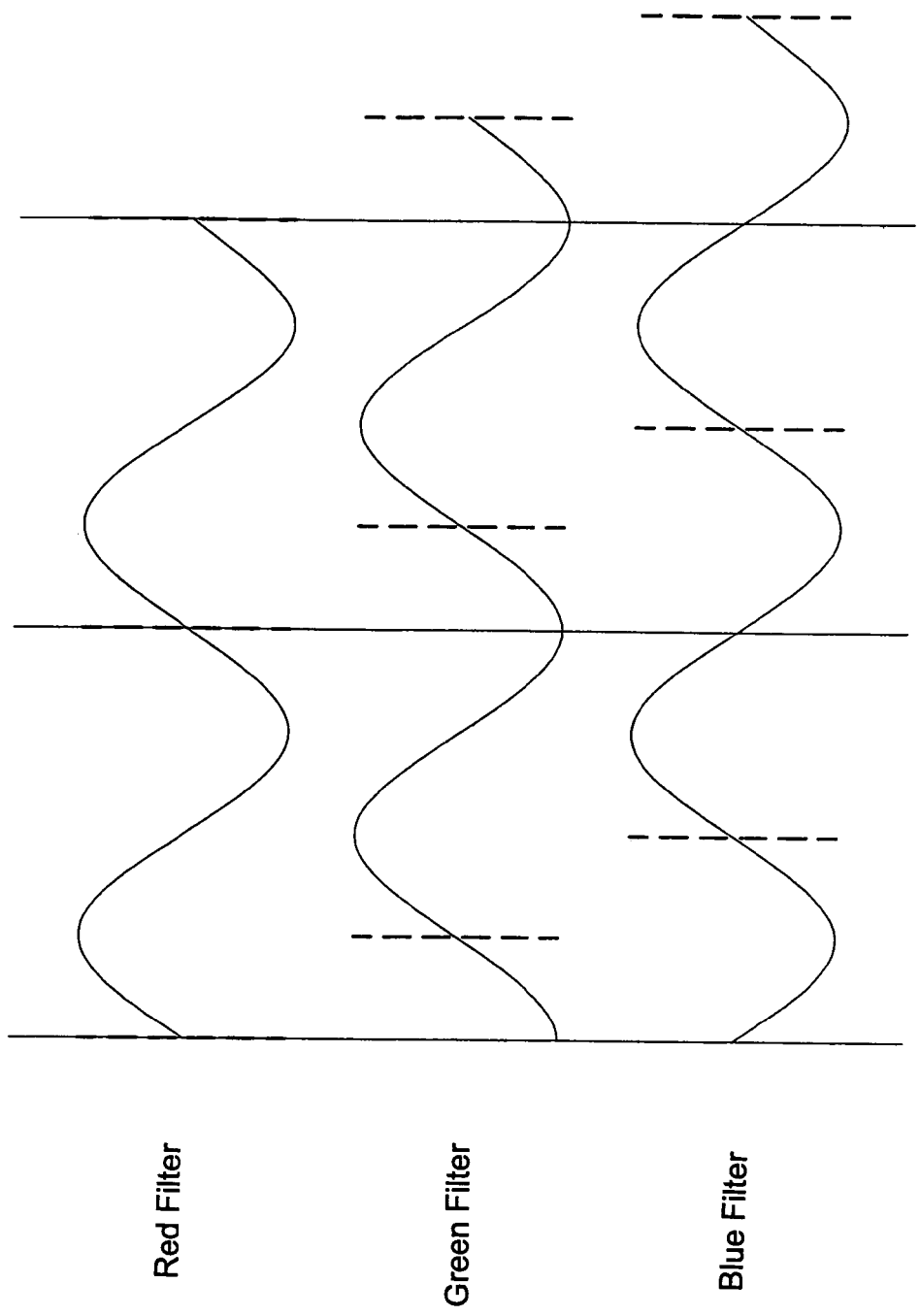
FIG. 3 is a graph showing an example of the light intensity distribution of red, green, and blue filters with relative phase relationships different from one another.
Figure 4:
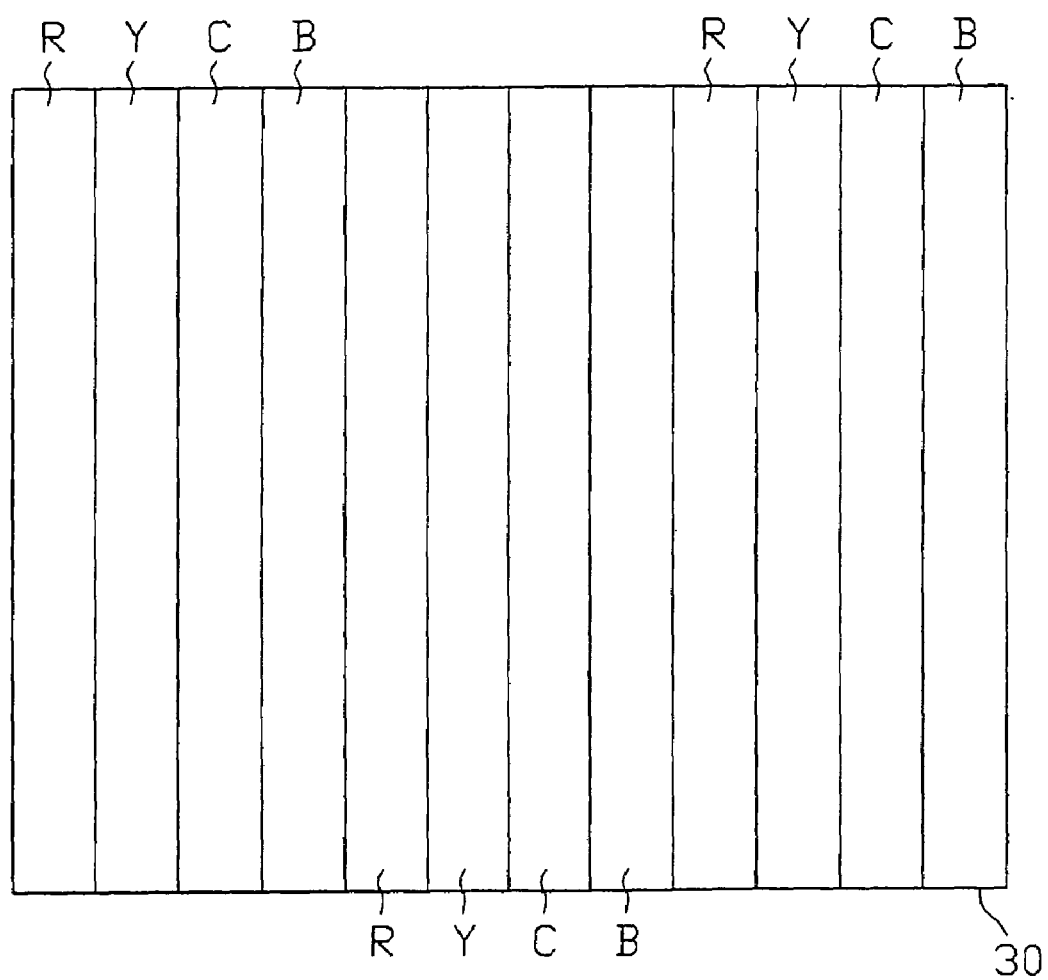
FIG. 4 is a plan view showing a typical example of the striped grid in the second embodiment of the present invention.

The illumination device 3 of the present invention illuminates light component patterns of red, green, and blue each having a different phase from one another. More specifically, as shown in FIG. 2, the illumination device 3 includes a light source 11, a condensing lens 12 for condensing the light from the light source 11, an illuminating lens 13, and red, green, and blue filter striped plates 14, 15, and 16 placed between the condensing lens 12 and the illuminating lens 13. The degree of red color of the red filter striped plate 14 changes in the sine wave form (striped) corresponding to the locations thereon. The red filter striped plate 14 allows only the red components to pass through in a striped form and allows all the lights of other wave length bands to pass through. Further, the degree of the green color of the green filter striped plate 15 changes in the sine wave form (striped) corresponding to the locations thereon. The green filter striped plate 15 allows only the green components to pass through in a striped form and allows all the lights of other wave length bands to pass through. However, the phase of the sine wave is shifted by a predetermined pitch ("π/2" in this embodiment) comparing to the red filter striped plate 14 (FIG. 3). In addition, the degree of the blue color of the blue filter striped plate 16 changes in the sine wave form (striped) corresponding to the locations thereon. The blue filter striped plate 16 allows only the blue components to pass through in a striped form and allows all the lights of other wave length bands to pass through. However, the phase of the sine wave is shifted by a predetermined pitch ("π/2" in this embodiment) comparing to the green filter striped plate 15 (FIG. 3). In other words, these red, green, and blue filter striped plates 14, 15, and 16 are overlapped together in a condition where each phase is shifted from one another (of course, it is also possible that they are mutually separated from one another) The light emitted from the light source 11 is illuminated (irradiated) onto the printed circuit board K through the condensing lens 12, the colored filter striped plates 14, 15, 16, and the illuminating lens 13 as light component patterns as shown in FIG. 4.

Further, the CCD camera 4 noted above is composed of a first, second, and third dichroic mirror 21, 22, 23 as well as a first, second, and third image pick-up members 24, 25, 26 corresponding to the dichroic mirrors. Namely, the first dichroic mirror 21 reflects the light within a predetermined wave length band (corresponding to the red light) and allows the other lights to pass through. The first image pick-up member 24 retrieves the image of the reflected light from the mirror 21. Further, the second dichroic mirror 22 reflects the light within a predetermined wave length band (corresponding to the green light) and allows the other lights to pass through. The second image pick-up member 25 retrieves the image of the reflected light from the mirror 21. Moreover, the third dichroic mirror 23 (a regular mirror can be used) reflects the light within a predetermined wave length band (corresponding to the blue light) and allows the other lights to pass through. The third image pick-up member 26 retrieves the image of the reflected light from the mirror 23. In addition, the CCD camera 4 can also pick-up a general color image.

In the present embodiment, as shown in FIGS. 1 and 2, a control device 7 is provided for controlling the operations of the CCD camera 4, the illuminating device 3, the motors 5 and 6, and the white light illumination unit L, as well as conducting various calculations based on the image data retrieved by the CCD camera 4. In other words, when the printed circuit board K is placed on the table 2, the control device 7 controls the motors 5 and 6 to move to a predetermined position, thereby transferring the printed circuit board K to an initial position. This initial position is, for example, one of the positions corresponding to the pre-divided surface of the printed circuit board K where the surface is divided based on a unit of the visual field of the CCD camera 4.

Further, the control device 7 controls the white light illumination unit L to start the illumination of the white light. The amount of the reflected white light from the planar part of the printed circuit board K towards the CCD camera is small and becomes dark. On the other hand, the amount of the reflected light from the cream solder H is large and becomes bright due to the irregular reflection caused by the surface irregularity of the cream solder. When the illumination is being performed, the control device 7 controls the operation of the CCD camera 4 to pick-up the images of the inspection area at once, thereby obtaining the color image data (the first image retrieval).

Next, the illumination device 3 is operated to begin the illumination of the light component pattern. In this process, since a plurality of wave length bands where the phases are different from one another by the predetermined pitch are included in the light component pattern, the phases do not have to be shifted per predetermined pitch as was required in the conventional technology. Moreover, during the illumination process where the light component patterns whose phases are shifted are irradiated at the same time, the control device 7 controls the operation of the CCD camera 4 so that the images of the inspection area are picked-up per each of the wave length bands (image pick-up member 24–26), thereby obtaining the image data of three screens (the second image retrieval).

Further, the laser pointer is operated for determining the height of cream solder H. The height of the part selected in the method explained later is measured as a standard height of the inspected area.

The control device 7 is comprised of an image memory, which sequentially stores the image data. Based on the stored image data, the control device 7 conducts various image processing. During the image processing, the control device 7 controls the operation of the motors 5 and 6 to move the table 2 to the next inspection area. The control device 7 stores the image data retrieved in the manner noted above in the image memory. On the other hand, when the image processing in the image memory is completed, the control device 7 can immediately conduct the next image processing since the next image data is already acquired in the image memory. In other words, the inspection is conducted by transferring the next inspection area (m+1) and retrieving the image data, and at the same time, performing the image processing for the $m^{th}$ image data and image comparison. Such parallel processing noted above is repeated until the inspection for the all of the inspection areas is completed. As in the foregoing, in the printed state inspection device 1 of the present invention, the control device 7 controls to shift the inspection area while sequentially conducting the image processing so that the printed state of the cream solder H on the printed circuit board K can be quickly and accurately inspected.

Next, the image process, an arithmetic process, as well as a comparison process conducted by the control device 7 will be explained. First, a solder area in which the cream solder H is printed is extracted by using the image data obtained in the first image retrieval process. In other words, the control device 7 produces binary data based on the data concerning the brightness in the image data with reference to a predetermined threshold. In the image data from the first image retrieval, as described above, the solder area is bright and the other areas are dark. Due to this difference, by recognizing the bright area as the solder area, the solder area as well as the non-solder area which is the surface of printed circuit board K printed with the cream solder H, are detected.

The part for measuring the standard height is selected by the control device 7 within the non-solder area that has been detected as noted above. The non-solder area is the surface of the printed circuit board K, and can be easily measured by the laser pointer because it is a flat surface.

Next, the control device 7 calculates the height within the solder area by using the image data of three screens obtained in the second image retrieval process. A phase shift is created based on the difference in the height with respect to the light pattern projected on the cream solder H. Then, the control device 7 calculates the height of the reflection surface of the cream solder based on the principle of the phase shift method (striped inspection method) with use of the image data at each wave length band where the phases of the light pattern are shifted by the predetermined pitch.

In other words, the brightness of the point P on each screen can be expressed by the formula representing each of the sine waves. In the embodiment of the present invention, the relative phase relationship for the colors red, green, and blue are indicated as α, 0, and β (where, α≠0, β≠0, and α≠β), respectively, and the brightness V0, V1, and V2 of the point P on each screen, where the amplitude and offset components are matched, can be expressed by the following formula.

$$V0 = A\sin(\theta + \alpha) + B \quad (2a)$$

$$V1 = A\sin\theta + B \quad (2b)$$

$$V2 = A\sin(\theta + \beta) + B \quad (2c)$$

where, θ represents positional information for obtaining the height, A represents an amplitude, and B represents an offset component.

By these formulas (2a)–(2c), the following formula (2d) is evolved.

$$\tan\theta = \frac{(V0-V2)\sin\beta + (V1-V2)(\sin\alpha - \sin\beta)}{(V0-V2)(1-\cos\beta) - (V1-V2)(\cos\alpha - \cos\beta)} \quad (2d)$$

$$\tan\theta = \frac{(V1-V2)\sin\alpha + (-V1+V0)\sin\beta}{(V0-V2) + (-V1+V2)\cos\alpha + (V1-V0)\cos\beta}$$

Here, in the present embodiment, because the phase is shifted by π/2, it can express α=π/2, =−π/2. Then, the following formula (2e) is evolved from the formula (2d).

$$\tan\theta = (2V1-V0-V2)/(V0-V2) \quad (2e)$$

Further, by the formula (2e), the following formula (2g) is evolved.

$$\theta = \arctan\{(2V1-V0-V2)/(V0-V2)\} \quad (2g)$$

By using the calculated positional information θ calculated in the foregoing manner, a height Z of the point P in the solder area is determined based on the formula below.

Here, when an angle formed by the lead line of the illumination device 3 and the illuminated beam from the illumination device 3 to the point P is represented by ε, the angle ε can be expressed by the following formula (3).

$$\epsilon = f(\theta + 2n\pi) \quad (3)$$

Then, the height Z is evolved with respect to the following formula (4).

$$Z = Lp - Lpc/\tan\epsilon + Xp/\tan\epsilon \quad (4)$$

where, Lp represents a height from the standard surface of the illuminating device 3, Lpc represents a distance in the X-axis direction between the CCD camera 4 and the illuminating device 3, and Xp represents the X coordinate of the point P.

The height data of the point P obtained in such a way is calculated by the unit of each pixel P of the retrieved image screen, and is stored in the memory of the control device 7. Moreover, based on the data of each unit, the amount of the printed cream solder H is calculated by integrating the height of each point within the solder area. Then, the data such as the position, area, height, and amount of cream solder H determined in this manner is compared with the standard data stored in advance, where the pass/fail of the printed state of the cream solder H in the inspection area is determined by finding out whether the result of the comparison is within the tolerance range or not.

As explained above, according to the embodiment of the present invention, the height of the cream solder H is calculated based on the image data from the first image retrieval process and the three image data from the second image retrieval process conducted by the CCD camera 4 under the different relative phase relationships. Therefore, unlike the conventional technology where an image pick-up had to be conducted every time when the relative phase relationship is changed, the image retrieval in the present invention can be conducted at the same time for each light component with different relative phase relationship. As a consequence, two illumination processes as well as two image pick-up processes can be conducted per point, which significantly reduces the time required for the illumination and the image pick-up, thereby dramatically shortening the time required for the measurement. When the light component pattern of predetermined wave length components is illuminated, the reflection rate becomes considerably different depending on the degree of colors on the measurement object. In the present invention, however, even in such a case, the influence of the reflection rate is canceled out by conducting the second image retrieval process. As a result, the accuracy of measurement can be further improved.

Moreover, since the height of the cream solder H can be determined based on the three image data, the total amount of data becomes smaller in comparison to the conventional technology where the calculation was conducted based on four image data. Therefore, the calculation time is significantly shortened.

In particular, in the present invention, the positional information θ can be determined based on a formula not very complicated, and the height can be calculated based on the positional information θ obtained by the formula. As a result, a delay that would be resulting from complicated calculations can be avoided, thereby securely achieving the effects of the present invention.

Further, in the above example, the illumination device 3 is formed with the filter striped plate mechanism that is capable of illumination upon synthesizing each light component pattern having a relative phase relationship different from one another by using filter striped plates 14–16. As a result, the structure of the illumination device 3 can be simplified since it is unnecessary to use liquid crystals.

In addition, when the white light illumination unit L illuminates the white light from the above in a diagonal direction towards the printed circuit board K printed with cream solder H, the brightness of the reflected light is different between the solder area and the non-solder area. Due to this difference, the solder area and the non-solder area can be detected through an easy process of comparing the brightness of the image data, regardless of the surface colors of the cream solder H and the printed circuit board K. Hence, calculation for compensation in consideration of the non-solder area does not have to be performed. As a result, the calculation can be simplified, and increase of the size of the equipment for compensation calculation or complications of the equipment can be avoided.

Further, the calculation of the height from the image data based on the second image retrieval process is conducted only for the solder area. The solder area is configured by one color, and there is no difference in color among different products. Thus, problems such as not being able to obtain the appropriate brightness and to calculate the height due to imbalance for the red, green, and blue reflected light can be avoided.

The embodiment of the present invention is not limited to the context explained above, and thus, can also be implemented in the following manners.

(a) In the above embodiment, the illumination device 3 is comprised of the red, green, and blue filter striped plates 14, 15 and 16, respectively. However, as shown in FIG. 4, a striped plate 30 can be alternatively used which is structured by printing (or painting) stripes with a constant width in the order of red R, yellow Y, cyan C, blue B, red R, yellow Y, cyan C, blue B, and so forth on a piece of transparent plate such as a glass plate. The degree of color for each stripe is uniformly made rather than a sine wave manner.

Figure 5A:
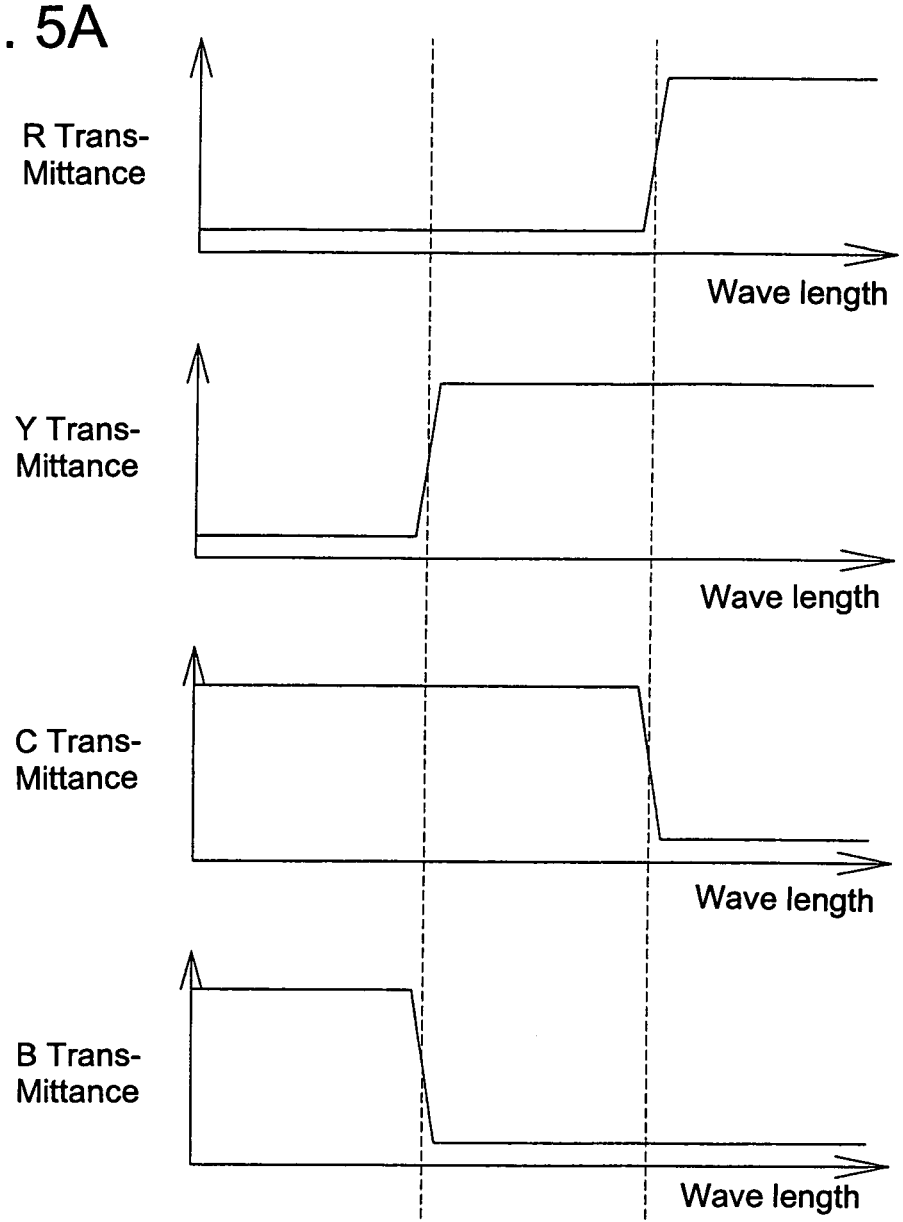
FIG. 5A is a graph showing the relationship between the transmittance and wave length of each color of the striped plate in the second embodiment.
Figure 5B:
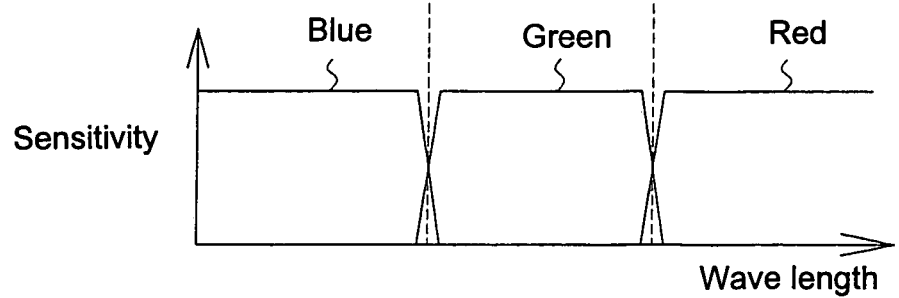
FIG. 5B is a graph showing the relationship between the sensitivity and wave length of the camera in the second embodiment.

More specifically, in each stripe, a pigment which allows only a specific wave length to pass there through but to shield the other wave lengths is used. In other words, as shown in FIG. 5, the red R makes the wave length of only the red colored components translucent. The yellow Y makes the wave length of the yellow colored components, namely, only the red and green colored components translucent. The cyan C makes the wave length of the cyan colored components, namely, only the green and blue colored components translucent. The blue B makes the wave length of only the blue colored components translucent. At this time, the red, green, and blue wave length bands that allow the light pass through preferably match the high sensitivity red, green, and blue wave length bands in the CCD camera 4.

Figure 6:
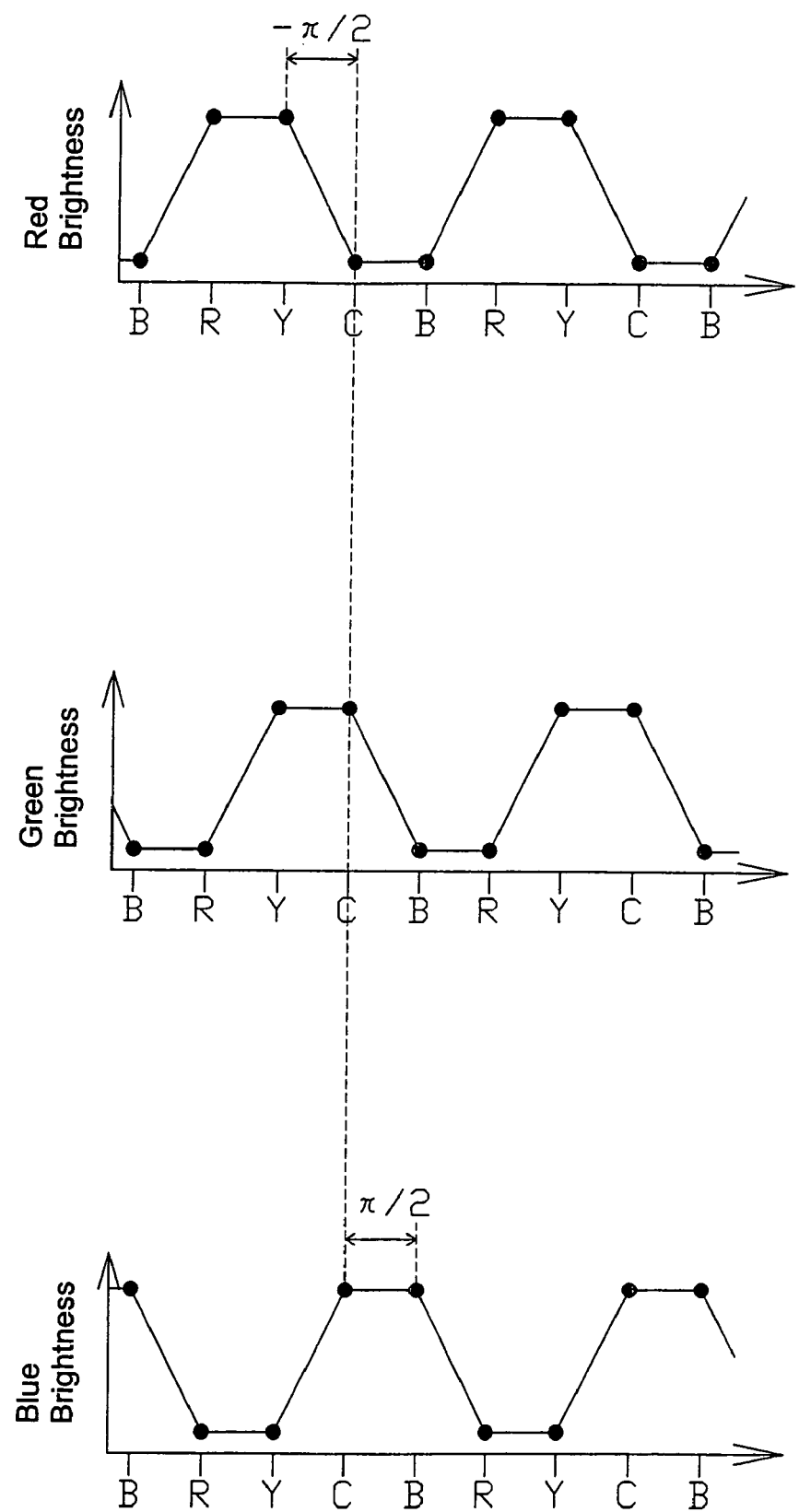
FIG. 6 is a graph showing the brightness per individual wave length in the illuminated area projected with the transmitted light from the striped plate.

Since the order of color in each stripe is red R, yellow Y, cyan C, and blue R, the translucent part and the shielded part are repeated in the striped plate 30 at a predetermined interval per every wave length for the red, green, and blue components. As a consequence, when the translucent light of striped plate 30 is projected onto an illumination area, the brightness per individual wave length of the illumination area becomes almost a sine wave form as shown in FIG. 6. Moreover, the relative phase relationships for the colors red, green, and blue are $-\pi/2$, 0, $\pi/2$, respectively. Therefore, by applying the striped plate 30, the illumination of the light pattern for calculating the height can be performed.

The number of colors used in the striped plate 30 can be four or more such as 8, 10, or 16.

Further, the colors red, green, and blue can be printed (or painted) on one striped plate, as well as have the phase of each color shifted by a predetermined pitch when printing (or painting). In such a case, the degree of each color need not always be the sine wave form but can be a rectangular wave form as well.

Further, by printing a stripe with a constant width in the order of red, green, and blue, a striped plate can be structured. In this case, the brightness of the illumination area per each wave length becomes almost a sine wave form, and the relative phase relationships for the colors red, green, and blue are $-2\pi/3$, 0, $2\pi/3$, respectively.

(b) In the embodiment described above, the solder area as well as the non-solder area are detected by the brightness of the reflected light during the illumination process by the white light illumination unit L in a diagonal direction. However, by conducting a color image retrieval operation for the reflected light when irradiating the white light from the above, the solder area and the non-solder area can be distinguished by the difference in color between the cream solder H and the printed circuit board K.

(c) The height measurement of the standard surface is not limited to the measurement by the laser pointer, and other measuring devices can be used. Moreover, the height measurement of the standard surface can be measured by a phase shift method for the image area of the three light component patterns obtained by the second image retrieval process corresponding to the non-measurement area of the objected detected by the first image retrieval process. In this case, if the difference in the reflection rate per every individual color becomes a problem, the height can be calculated by compensating the difference by an appropriate correction means. For example, the height can be calculated by adding new three screen image data obtained by illuminating another white light by installing a half mirror on the same axis as the illumination device 3. Moreover, the height measurement of the standard surface can be measured by converting the positional change of the light component pattern to the height data based on the principle of the triangular survey, while using the image of at least one light component pattern obtained by the second image retrieval process corresponding to the non-measurement area of the object detected by the first image retrieval process.

(d) Each of the light component pattern in the above embodiment does not always have to be strictly differentiated as red, green, and blue. In other words, it is only necessary to differentiate the wave length bands from one another, thus, the light component patterns can have in-between colors such as yellow (RG) and cyan (bluish-green).

(e) Further, the light component patterns can have four components instead of three to obtain the image data with four screens through the second image retrieval process, and the height can be calculated by using the four screen image data.

(f) In the above embodiment, the case of measuring the height of the cream solder H printed on printed circuit board K has been described in detail. However, the present invention can be implemented for the case of measuring the height of the cream solder printed on an IC package (such as leads) as well. Moreover, measuring the height of other measurement objects can be achieved as well. Such other measurement objects include a printed product where print is formed on a substrate or a layered body.

(g) Further, the present invention can be implemented as an inspection device for the solder bump, where the shape and volume of the solder bump are calculated and inspected based on the outline and height of the detected solder area. In this case, the solder bump can be fully inspected even if it is shaped like a ball.

(h) When the filter striped plates 14, 15, 16 or the striped plate in the modification (a) noted above are produced, such a filter striped plate can be made by printing or painting, or attaching inorganic filters such as dichroic filters in a striped manner, or irradiating a light pattern with a plurality of wave lengths on a photosensitive film.

(i) In the above embodiment, the white light from the white light illumination unit L is illuminated as the light for detecting the areas. On the other hand, the light is not particularly limited to the white light, and can, for example, be one of the lights of red, blue, green, cyan, and yellow, etc.

(j) In the above embodiment, the printed state inspection device 1 is comprised of the white light illumination unit L and the illumination device 3. However, the white light illumination unit L can be eliminated, and an illumination device which is capable of illuminating a UV ray as well as a red, green, and blue light component patterns having phase relationships different from one another can be mounted instead of the illumination device 3. In other words, the illuminating device is comprised of a light source, a condensing lens, an illuminating lens, and filter striped plates. The light source can emit UV rays in addition to the red, green, and blue colored wave lengths (white light) at the same time. Moreover, the filter striped plates shield (or make translucent) the red, green, and blue colored wave lengths in a striped manner and allows all of the UV rays to pass through. Also, in this case, instead of the CCD camera 4 noted above, a CCD camera that is capable of image picking-up in the red, green, and blue wave length bands as well as the UV rays at the same time, and obtaining the image data separately for each wave length band can be used.

With the above mentioned structure, four image data can be obtained by conducting only one image retrieval process. Then, the image data of the UV rays in the four image data can be utilized to detect the area of the measurement object, and the three image data of the red, green, and blue wave length bands can be utilized to calculate the height.

As a result, since the white light illumination unit L does not need to be installed, a small and inexpensive printed state inspection device can be established. Moreover, since the image pick-up process only has to be conducted once, high speed processing can be achieved.

The wave length band is not limited to the UV ray, and it can be a wave length band other than the white light, such as an infrared light.

What is claimed is:

1. A three-dimensional measuring instrument, comprising:
    a uniform light illumination unit which is capable of a uniformly illuminating a measurement object as well as surrounding non-measurement objects;
    an illuminating means having a striped light intensity distribution and is capable of illuminating at least two light component patterns with different wave length components and different relative phase relationships at the same time onto at least the measurement object;
    an image retrieval means which is capable of retrieving images of reflected lights from the measurement object as well as the surrounding non-measurement objects illuminated with the uniform light, and is also capable of retrieving images of reflected lights at least from the measurement object illuminated with the light component pattern separately for each light component;
    an area extracting means for extracting an existing area of the measurement object based on the image data derived from the uniform light retrieved by the image retrieval means; and
    a computing means for calculating a predetermined height of the measurement object whose existing area is extracted by the area extracting means based on at least two image data retrieved by the image retrieval means.

2. A three-dimensional measuring instrument as defined in claim 1 wherein the uniform light illumination unit is a white light illumination source which is capable of illuminating a white light.

3. A three-dimensional measuring instrument as defined in claim 1, wherein the area extracting means extracts the existing area of the measurement object based on differences in color of the measurement object and the non-measurement objects.

4. A three-dimensional measuring instrument as defined in claim 1, wherein the illuminating means is capable of illuminating at least three light component patterns at the same time, and wherein the computing means calculates based on the three image data, and when the relative phase relationships different from one another are indicated as α, 0, and β, the computing means determines positional information θ by formula (1) as well as by V0, V1, and V2 which are converted values of the brightness of the measured part obtained from said three image data to be identical amplitudes and offsets, to calculate the predetermined height based on the positional information θ:

$$\tan\theta = \frac{(V0-V2)\sin\beta + (V1-V2)(\sin\alpha - \sin\beta)}{(V0-V2)(1-\cos\beta) - (V1-V2)(\cos\alpha - \cos\beta)} \quad (1)$$

$$\tan\theta = \frac{(V1-V2)\sin\alpha + (-V1+V0)\sin\beta}{(V0-V2) + (-V1+V2)\cos\alpha + (V1-V0)\cos\beta}.$$

5. A three-dimensional measuring instrument as defined in claim 4, wherein the three light component patterns having wave length components different from one another are light component patterns of red, green, and blue.

6. A three-dimensional measuring instrument as defined in claim 1, wherein the illuminating means is comprised of a filter striped plate mechanism which is capable of illuminating each light component pattern having a different relative phase relationship from one another at the same time by using the filter striped plate where the light from a light source is shielded in a striped manner for the predetermined wave length components and remaining wave length components are allowed to pass therethrough.

7. A three-dimensional measuring instrument as defined in claim 1, wherein the illuminating means is comprised of a filter striped plate where the filter striped plate is structured by one plate which has areas for allowing the light from a light source to transmit therethrough only predetermined wave length components arranged in a striped manner, and is capable of transmitting each light component pattern with different relative phase relationship at the same time.

8. A three-dimensional measuring instrument as defined in claim 7, wherein the illuminating means is capable of illuminating the three light component patterns at the same time, where the wave length components are different from one another and indicated as first, second, and third wave length components, wherein the filter striped plate has areas arranged in a striped manner in the order of a first area for allowing only the first wave length component to pass through, a second area for allowing only the first and second wave length components to pass through, a third area for allowing only the second and third wave length components to pass through, and a fourth area for allowing only the third wave length component to pass through.

9. A three-dimensional measuring instrument as defined in claim 8, wherein the first area is colored red, the second area is colored yellow, the third area is colored cyan, and the fourth area is colored blue.

10. A three-dimensional measuring instrument as defined in claim 1 wherein the light component pattern has light intensity distribution of approximately sine wave form.

11. A three-dimensional measuring instrument as defined in claim 1, further comprising a standard height measuring means for measuring a height of a standard surface, which is a standard height of the measurement object.

12. A three-dimensional measuring instrument as defined in claim 1, wherein the measurement object is cream solder printed on a printed circuit board, and a judging means is provided for determining pass/fail of a printed state of the cream solder based on height and area of the cream solder.

13. A three-dimensional measuring instrument as defined in claim 1, wherein the measurement object is a solder bump established on a printed circuit board, and a judging means is provided for determining pass/fail of a shape of the solder bump based on the height and area of the solder bump.

14. A three-dimensional measuring instrument, comprising:
a white light illumination unit which is capable of illuminating a white light on a measurement object as well as surrounding non-measurement objects;
an illuminating means having a striped light intensity distribution and is capable of illuminating at least three light component patterns with different wave length components and different relative phase relationships at the same time onto at least the measurement object;
an image retrieval means which is capable of retrieving images of reflected lights from the measurement object as well as the surrounding non-measurement objects illuminated with the white light, and is also capable of retrieving images of reflected lights at least from the measurement object illuminated with the light component pattern separately for each light component;
an area extracting means for extracting an existing area of measurement object based on the image data derived from the white light retrieved by the image retrieval means; and
a calculating means for calculating a predetermined height of the measurement object the existing area of which has been extracted by the area extracting means by a phase shift method based on at least three image data retrieved by the image retrieval means.

15. A three-dimensional measuring instrument as defined in claim 1, wherein the area extracting means extracts the existing area of the measurement object based on differences in brightness between the measurement object and the non-measurement objects.

16. A three-dimensional measuring instrument as defined in claim 15 wherein an illuminating direction of the white light illumination unit towards the measurement object and the non-measurement objects has an angle different from an image retrieval direction of the image retrieval means towards the measurement object and the non-measurement objects.

17. A three-dimensional measuring instrument, comprising:
an illuminating means which is capable of illuminating, at the same time, the light having substantially uniform wave length components and the light component patterns having at least striped light intensity distribution as well as a plurality of predetermined wave length components having relative phase relationships different from one another;
an image retrieval means which is capable of separating and retrieving the image of the light reflected from the measurement object illuminated by the illuminating means per every uniform wave length component as well as per every individual predetermined light component of the plurality of predetermined wave length components;
an area extracting means for extracting the existing area of the measurement object based on the image data corresponding to the uniform wave length components retrieved by the image retrieval means, and
a computing means for calculating the predetermined height of at least the measurement object whose existing area has been detected by the are extracting means.

18. A three-dimensional measuring instrument as defined in claim 17, wherein the wave length band of the uniform wave length components and the wave length band of the plurality of predetermined wave length components are different from each other.

* * * * *